(12) United States Patent
Nanda et al.

(10) Patent No.: US 7,317,411 B1  
(45) Date of Patent: Jan. 8, 2008

(54) DELTA-SIGMA MODULATOR HAVING QUANTIZER CODE PATTERN DETECTION CONTROLLED DITHER

(75) Inventors: Kartik Nanda, Austin, TX (US); Timothy Thomas Rueger, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/534,195

(22) Filed: Sep. 21, 2006

(51) Int. Cl. *H03M 3/00* (2006.01)
(52) U.S. Cl. ...................... 341/143; 341/131
(58) Field of Classification Search ......... 341/130–143
See application file for complete search history.

(56) References Cited

U.S. PATENT DOCUMENTS

| | | |
|---|---|---|
| 6,738,004 B2 | 5/2004 | Melanson |
| 6,888,484 B2 * | 5/2005 | Kiss et al. .................. 341/143 |
| 7,064,698 B2 * | 6/2006 | Locher et al. .............. 341/143 |
| 7,129,874 B2 * | 10/2006 | Bjornsen ................... 341/143 |

OTHER PUBLICATIONS

U.S. Appl. No. 11/297,016, filed Dec. 8, 2005, Melanson, et al.
U.S. Appl. No. 11/297,011, filed Dec. 8, 2005, Melanson.
Robert, et al., "A Second-Order High-Resolution Incremental A/D Converter with Offset and Charge Injection Compensation", IEEE JSSC, vol. 23, No. 3, Jun. 1988.
Quinquempoix, et al., "A Low-Power 22-bit Incremental ADC with 4ppm INL, 2ppm Gain Error and 2uV DC Offset", Proceedings of ESSIRC, Grenoble, FR 2005.

\* cited by examiner

*Primary Examiner*—Lam T. Mai
(74) *Attorney, Agent, or Firm*—Andrew M. Harris; Mitch Harris, Atty at Law, LLC

(57) ABSTRACT

A delta-sigma having quantizer code pattern detection controlled dither reduces the probability of "stuck" code sequences that occur when the input signal and feedback signal are equal and thus no quantizer output change occurs. In particular, in modulators that are periodically reset, the pattern detection and dither control reduce the probability of a stuck code sequence at startup. A pattern detection circuit detects a sequence of unchanging quantizer output values and injects a signal at the quantizer input to cause the quantizer to change levels. The injected signal may be a dither signal that is increased in amplitude in response to the detection of unchanging code sequences and then decreased when the quantizer output changes.

20 Claims, 4 Drawing Sheets

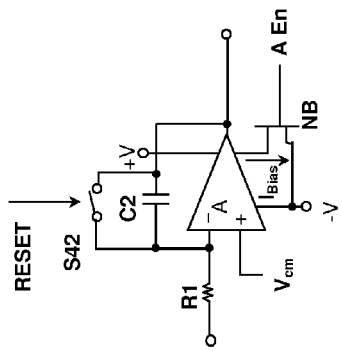
Fig. 4B
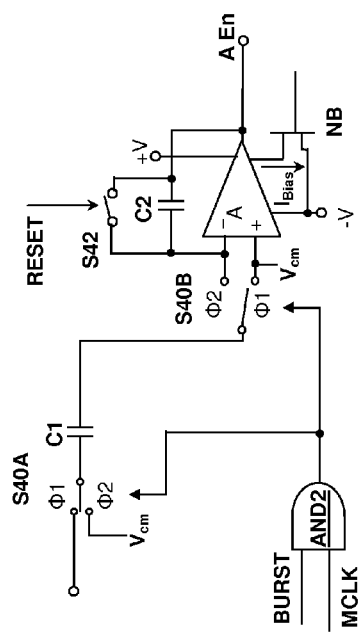
Fig. 4A
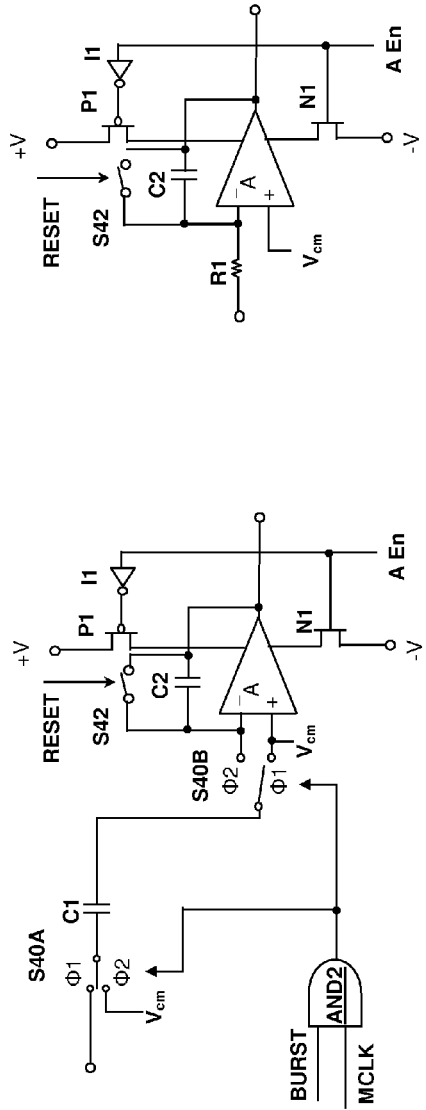
Fig. 4D
Fig. 4C

DELTA-SIGMA MODULATOR HAVING QUANTIZER CODE PATTERN DETECTION CONTROLLED DITHER

CROSS-REFERENCE TO RELATED APPLICATIONS

The present application is related to co-pending U.S. patent application Ser. No. 11/543,191, entitled "DELTA-SIGMA ANALOG-TO-DIGITAL CONVERTER (ADC) HAVING AN INTERMITTENT POWER-DOWN STATE BETWEEN CONVERSION CYCLES", filed on even date herewith, having at least one common inventor, and assigned to the same assignee. The above-referenced U.S. patent application is incorporated herein by reference.

BACKGROUND OF THE INVENTION

1. Field of the Invention

The present invention relates generally to analog-to-digital converters, and more specifically, to a delta-sigma analog-to-digital converter having a dither controlled based on detected quantizer code patterns.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. The relative simplicity of the architecture and the ability to finely control the quantization noise makes delta-sigma converter implementations very desirable.

The delta-sigma modulator based ADC typically includes an analog loop filter that receives an input signal and a quantizer that converts the analog output of the loop filter to a digital representation. A feedback signal provided from the output of the quantizer is provided to the analog loop filter to close the loop such that the average output of the quantizer is equal to the value of the input signal. The output of the quantizer is then filtered by a low-pass digital filter having a large number of taps, in order to provide an accurate conversion result from the quantizer output, which typically includes hundreds of values per conversion cycle.

Dither is often introduced to the analog loop filter or directly into the quantizer, in order to ensure that the signal level being quantized has sufficient changes so that the quantizer output is constantly changing and therefore providing the above-described noise shaping operation. In precision ADCs, it is desirable to under-dither, that is, to provide a peak-to-peak dither signal or value that represents less than a level that would generate a code change from the quantizer. Under-dithering provides for the greatest ADC dynamic range, as addition of the dither signal limits the range of signal values that in combination with the worst-case noise-shaping feedback and dither conditions (i.e., when the feedback, dither and input signal provide the same polarity and are of maximum magnitude when referred to the input to the quantizer) cause instability due to saturation at the quantizer output code range extremes.

However, under-dithering has a disadvantage in that when the sum of the feedback and input signal as referred to the input of the quantizer is static, the code from the output of the quantizer does not change unless the contribution of the dither signal or value is sufficient to cause the quantizer to change level. The result is a long sequence of unchanging quantizer output values, which causes the noise-shaping loop to temporarily become "stuck" in what is essentially an open-loop state. Normally, the very infrequent occurrence of such unchanging sequences is tolerable in ADC converters in exchange for the precision benefit gained from under-dithering. However, if the converter is reset, the production of such a unchanging sequence is more probable.

Therefore, it would be desirable to provide an under-dithered delta-sigma modulator that has a reduced frequency of stuck code sequences. It would further be desirable to provide such a delta-sigma modulator that can be reset without generating an excessive number of unchanging quantizer code sequences.

SUMMARY OF THE INVENTION

The above stated objective of providing an under-dithered delta-sigma modulator having a reduced number of stuck code sequences is realized in an analog-to-digital converter circuit and its method of operation.

The delta-sigma modulator includes a loop filter that provides an output to a quantizer input. The output of the quantizer is provided to a pattern detector that determines if the quantizer is producing a sequence of unchanging code values. The quantizer output is also provided to a DAC that generates a feedback signal provided to the loop filter to close the modulator loop. If a sequence of unchanging values is detected by the pattern detector, then a signal is injected into the quantizer input to cause the quantizer to change. The injected signal may be a dither signal having an amplitude that is increased by a scaling circuit when a pattern of unchanging values is detected. The dither amplitude is maintained in an increased state until the quantizer output changes and then is restored to an initial dither amplitude.

The pattern detector may ignore unchanging code values representing the extremes of the quantizer output range, so that the modulator is not further destabilized by injecting a signal while the quantizer is already producing a "saturated" sequence.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

FIGS. 4A-4D are circuit diagrams of integrator stages that may be employed in an ADC in accordance with an embodiment of the present invention.

DESCRIPTION OF ILLUSTRATIVE EMBODIMENT

The present invention encompasses a method and apparatus for preventing stuck code sequences produced from a delta-sigma modulator quantizer output when the feedback signal and input signal are close in value. In particular, the techniques of the present invention are applied to a delta-sigma modulator of a delta-sigma modulator based analog-to-digital converter (ADC) that supports substantially differing selectable sample rates by resetting the converter and shutting the modulator down between conversions. The present invention reduces the probability of long sequences of unchanging quantizer output codes that may otherwise be produced when the modulator is restarted, and may be applied in general to delta-sigma modulators operated continuously, as well.

A pattern detector circuit and dither signal generation circuit work together to inject a signal at the quantizer input whenever the pattern detector detects a sequence of unchanging quantizer output codes that indicate that the input signal and feedback signal are close in value. The signal injection circuit may be a dither circuit otherwise used to dither the quantizer input, or may be a separate circuit that injects signals only when an unchanging quantizer sequence is detected and may be used in conjunction with another dither generating circuit. The pattern detector may be incorporated within another circuit, such as a dynamic element matching (DEM) circuit that is already observing code patterns, or may be a stand-alone code run length detector.

Figure 1:
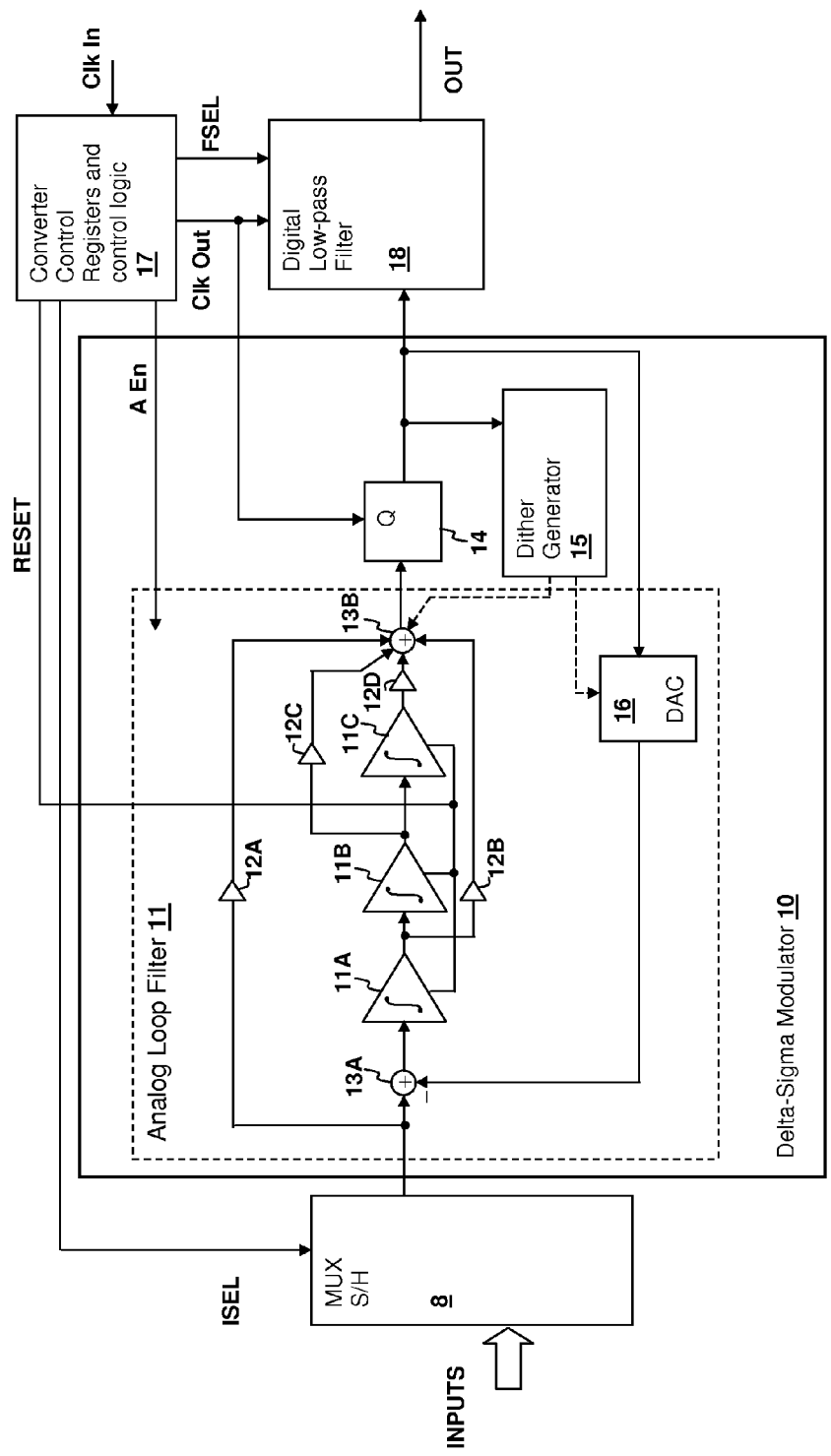
FIG. 1 is a block diagram depicting an ADC in accordance with an embodiment of the present invention.

Referring now to FIG. 1, an ADC converter circuit in accordance with an embodiment of the present invention is shown. A multiplexing sample/hold circuit 8 selects one of multiple input signals INPUTS that are provided to a delta-sigma modulator 10. Delta-sigma modulator 10 provides a digital output containing quantization noise and having a time-average value representing the input signal selected by multiplexing sample/hold circuit 8. A digital low pass filter provides a digital output OUT of the ADC by filtering the output of delta-sigma modulator 10. Converter control registers and logic 17 supplies clock signals to a digital low pass filter 18 and a quantizer 14 of delta-sigma modulator 10, and in discrete-time implementations of an analog loop filter 11 of delta-sigma modulator 10, provides the clocks to other portions of delta-sigma modulator 10.

Analog loop filter 11 is a feed-forward third-order loop filter design, which may be a continuous-time analog filter or may be a switched-capacitor filter. There are advantages to implementing analog loop filter 11 as a discrete-time circuit as will be pointed out in further detail below. However, it is understood that with appropriate additional isolation switching elements, analog loop filter 11 of the ADC circuit of the present invention may be implemented as a continuous-time analog filter. A series of cascaded integrators 11A-11C receive at a first integrator stage 11A, a signal representing the difference between the input signal selected by multiplexing sample/hold circuit 8 and a feedback signal provided by a digital-to-analog converter (DAC) 16 that converts the output of quantizer 14 to an analog signal. The output of quantizer 14 is also supplied to digital low-pass filter 18, which attenuates the quantization noise introduced by delta-sigma modulator 10.

A set of feed-forward signal paths are provided through scalers 12A-12D and are summed by a summer 13B that provides an analog input to quantizer 14. When a clock signal is applied to quantizer 14, the feedback signal provided by DAC 16 closes the loop around delta-sigma modulator 10, enforcing the condition that the time-average output of quantizer represents the selected input signal. A dither generator 15 provides a dither signal to quantizer 14 and receives a signal from a dither generator 15. Dither generator 15 increases the amplitude of the dither applied to summer 13B (or alternatively to an input of DAC 16) if a repetitive sequence of codes indicates that the feedback value and the input signal are equal or close to equal in value and therefore are reducing the noise-shaping action of the modulator by not changing the output of quantizer 14.

In the depicted embodiment, when the sample rate of the converter is at a maximum, the converter operates at least substantially continuously as described above, providing a digital output at the end of each conversion cycle that represents the analog input signal selected by multiplexing sample/hold circuit 8. Delta-sigma modulator 10 also may or may not be reset after each conversion. However, for sample rates substantially lower than the maximum sample rate, the depicted converter of can be operated intermittently and portions of the converter powered-down and reset prior-to performing another conversion, so that the power consumption of the converter can be reduced for lower sample rates, just as in non-delta-sigma converters. The embodiment shown herein makes it practical to design a single ADC to support a wide range of sample rates and still achieve desired power consumption performance for lower sample rates. For prior art designs, the power consumed by the analog circuits must typically be the same for higher sample rates and lower sample rates, as the analog loop filter must have the slew rate performance required at the highest sample rate.

Converter control registers and logic 17 controls the clock signals and power supply distribution to delta-sigma modulator, as well as to digital low-pass filter 18, so that either automatically when a lower sample rate is selected, or by register manipulation of bits within converter control registers and logic 17 in conjunction with a sample rate change, several operating changes are made for the lower sample rate. Clock signal Clk Out is changed from a continuous clock for the higher sample rate, to a burst clock at the lower sample rate, where the burst contains the same number of clocks at the lower sample rate that are required for a conversion cycle at the higher sample rate. Therefore, the duty factor of the burst is the ratio of the lower sample rate to the higher sample rate. For example, a converter supporting selectable operation at both 50 kHz and 5 kHz and having an over-sampling ratio of 256, would have a continuous Clk Out signal of 12.8 MHz when the 50 kHz sampling rate is selected and a 20 µS long burst of 256 clocks of frequency 12.8 MHz at intervals of 200 µS when the 5 kHz sampling rate is selected.

Between the clock bursts, which operate modulator at 12.8 Mhz even for the lower sampling rate, converter control registers and logic 17 disable the analog power supplies to analog loop filter 11 by disabling an analog circuit enable signal A En provided to analog loop filter 11. Analog circuit enable signal A En is re-enabled several modulator clock cycles, for example 10 clock cycles, so that integrators 11A-11C, summers 13A, 13B scalers 12A-12D and DAC 16 have stable outputs prior to re-applying clocks to quantizer 14, i.e., before the start of the next clock burst. The clock signal supplied to digital low-pass filter may also be halted after filtering of the conversion data provided during the clock burst is complete. A RESET signal is also supplied to analog loop filter 11, which causes integrators 11A-11C to be held in a reset state until the conversion is started. As pointed out above, the RESET signal may also be applied between conversions during continuous operation.

Additionally, converter control registers and logic 17 may either automatically when a lower sample rate is selected, or by register manipulation of bits within converter control registers and logic 17 in conjunction with a sample rate change, change the operation of digital low-pass filter 18 from that of a traditional symmetrical time-domain window function, to that of a half-filter response that starts at the peak value of the impulse response with the first sample and then decays to a substantially zero value. Because the burst operation and RESET signal described above enforce a known state in the modulator at the beginning of each conversion cycle for the lower sample rate, a half-filter response can be used for the for the digital low-pass filter 18 that provides substantially the same result that would be had from a traditional filter response that receives twice the number of modulator samples. Since the number of modulator samples per conversion cycle is constant when the lower sample rate is selected, e.g. 256, per conversion cycle in the example given above, using the half filter gives substantially the same performance as if the number of samples has been doubled, with the modulator still interrupted every 100 μS. If delta-sigma modulator 10 is reset in continuous mode operation, the same advantages can be had from the application of the half-filter.

The depicted embodiment also provides the ability to easily multiplex at lower sample rates, which is not present for converters employing continuously-operating modulators. At the maximum sample rate in the depicted embodiment, and for continuous modulator converters at any sample rate, if a new input of multiplexing sample/hold circuit 8 is selected, a conversion must be discarded due to the charge-injection involved in changing the multiplexing sample/hold circuit switch and the fact that delta-sigma modulator 10 is continuously running during the settling of the input signal as applied to the internal sample/hold of multiplexing sample/hold circuit 8, i.e., the transient generated by the switching of multiplexing sample/hold circuit 8 will be reflected in the output of quantizer 14 for the conversion in which the input selection is changed. The input selected by multiplexing sample/hold circuit 8 may be changed at any point between the clock bursts that is sufficiently ahead of the time required to stabilize the analog loop filter, for example, the input can be changed at the time when the analog circuits are re-enabled. Further, if delta-sigma modulator is reset in continuous mode operation, multiplexing sample/hold circuit 8 can be switched during that interval without disrupting operation.

In order to assure accurate operation when the converter is re-started at the lower sample rate, in the present invention, in order to assure accurate operation when the converter is re-started at the lower sample rate, dither generator 15 includes a pattern matching circuit. When a code sequence from quantizer 14 indicates that the feedback value and the input signal value are close in value, e.g., when a sequence of constant values is produced by quantizer 14, the amplitude of the dither signal generated by dither generator 15 is increased until the output of quantizer 14 changes. After the change is detected, the output of dither generator 15 is restored to the nominal value. Generally, in order to obtain the maximum possible accuracy, it is desirable to under-dither the quantizer, in order to provide the maximum possible dynamic range from the converter without instability in the modulator. However, when the input signal and the feedback value are the same or close in value, the quantizer output will not change, or will not change for a significant During the intermittent lower-sample rate conversion of the depicted embodiment, at the beginning of modulator operation, the output of summer 13A starts at zero due to the resetting of the modulator prior to the clock signal burst, and therefore such long sequences of repeated code values are more frequent for low input signal values. Therefore, dither generator 15 or some other mechanism is needed to ensure that the quantizer does not produce long sequences of the same quantizer output code value during startup of the modulator. For that purpose, dither generator 15 of the present invention is designed to detect the code(s) that indicate that the modulator loop is producing a sequence of values indicating that the quantizer is "stuck" at a particular quantization level, and an output signal that causes dither generator 15 to scale its output is provided. The extreme values (maximum and minimum outputs) of quantizer 14 are excluded from the unchanging code detection, so that delta-sigma modulator 10 is not further de-stabilized by the addition of dither when delta-sigma modulator 10 is already operating in a potentially unstable condition indicated by the output of quantizer 14 assuming an extreme value.

Figure 2:
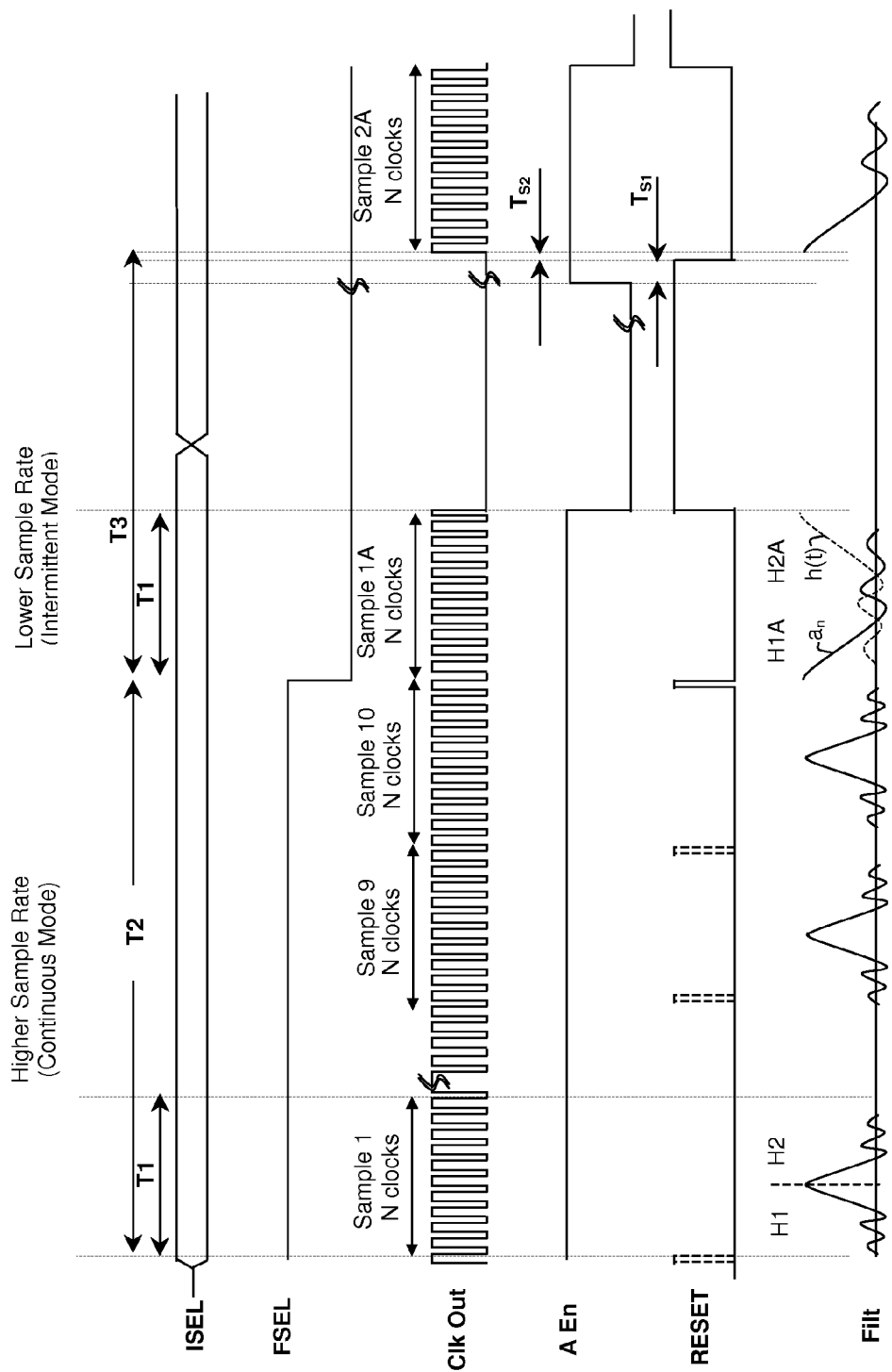
FIG. 2 is a signal timing diagram depicting signal relationships within the circuit of FIG. 1.

Referring now to FIG. 2, an exemplary set of signals within the circuit of FIG. 1 are shown in time and voltage relationship with each other, to further demonstrate the operation of the depicted embodiment. The clock output signal Clk Out is used to represent a single clock that operates the various digital portions of the ADC circuit of FIG. 1. However, it is understood that the actual clocks used to operate the various blocks may constitute several clocks and the clocks may be of differing frequency. For example, the output digital low-pass filter 18 might be operated at a lower clock frequency than quantizer 14, with a decimation-by-two block provided between the output of quantizer 14 and digital low-pass filter 18. Further, the clock bursts that intermittently operate quantizer 14 and digital low-pass filter 18 will generally be offset by at least one-half clock period so that valid output values of quantizer 14 are latched and subsequently operated on in digital low-pass filter 18.

The left-most portion of the signal diagram of FIG. 2, displays operation in a continuous mode corresponding to the maximum sample rate of the converter. Clock signal Clk Out is provided continuously, and the time periods indicated as T1 and T2 correspond to one conversion cycle and ten conversion cycles, respectively, in the left-most portion of the diagram. The right-most portion of the diagram depicts operation in the intermittent mode of the lower sample rate, where the time period T3 is again the time to perform one conversion cycle, and the time period T3 is the time between conversion cycles, which for the example given of a 10:1 ratio between higher and lower sample rates is equal to T2. Signal ISEL illustrates selection of an input signal by multiplexing sample/hold circuit 8, which for valid consecutive conversion cycles in the continuous mode on the left half of the diagram, must be made before those conversion cycles as shown, but for the intermittent mode shown in the right half of FIG. 2, can be made during the interval between conversion cycles.

Signal A En is the signal that enables the analog circuits in analog loop filter 11 and is shown as continuously enabled during continuous operation, and enabled at a time $T_{S1}+T_{S2}$ prior to the start of the clock burst of clock signal Clk Out. Signal RESET is de-asserted at time $T_{S2}$ prior to the start of the burst of clock signal Clk Out to enable switch S1 and as depicted may also be present during continuous mode operation and is also asserted prior to the first conversion cycle in intermittent mode. Finally, waveform Filt is representative of the coefficients of the time-domain window function of digital low-pass filter 18, which is shown in normal filter mode in continuous mode operation on the left side of the diagram, and in half-filter mode during intermittent operation. The impulse response h(t) shown in dashed lines is provided by multiplying the sequence of quantizer 14 output values corresponding to each modulator clock of the clock signal Clk Out burst with the coefficients of the window function shown as $a_n$.

The half-filter mode differs from the normal mode of digital low-pass filter 18, as illustrated by the asymmetric response shown with first half H1A having the peak coefficient placed at or near the first modulator sample (indicated by the first clock pulse of the clock burst of signal Clk Out) and generally decreasing amplitude to the end of the clock burst, with a lower energy during half-interval H2A compared to half-interval H1A. The normal response shown in the left half of the signal diagram has response halves H1 and H2 that are mirror images of each other. However, as noted above, if delta-sigma modulator 10 is reset between conversions in continuous mode, the half-filter response may also be used for those conversions.

Figure 3:
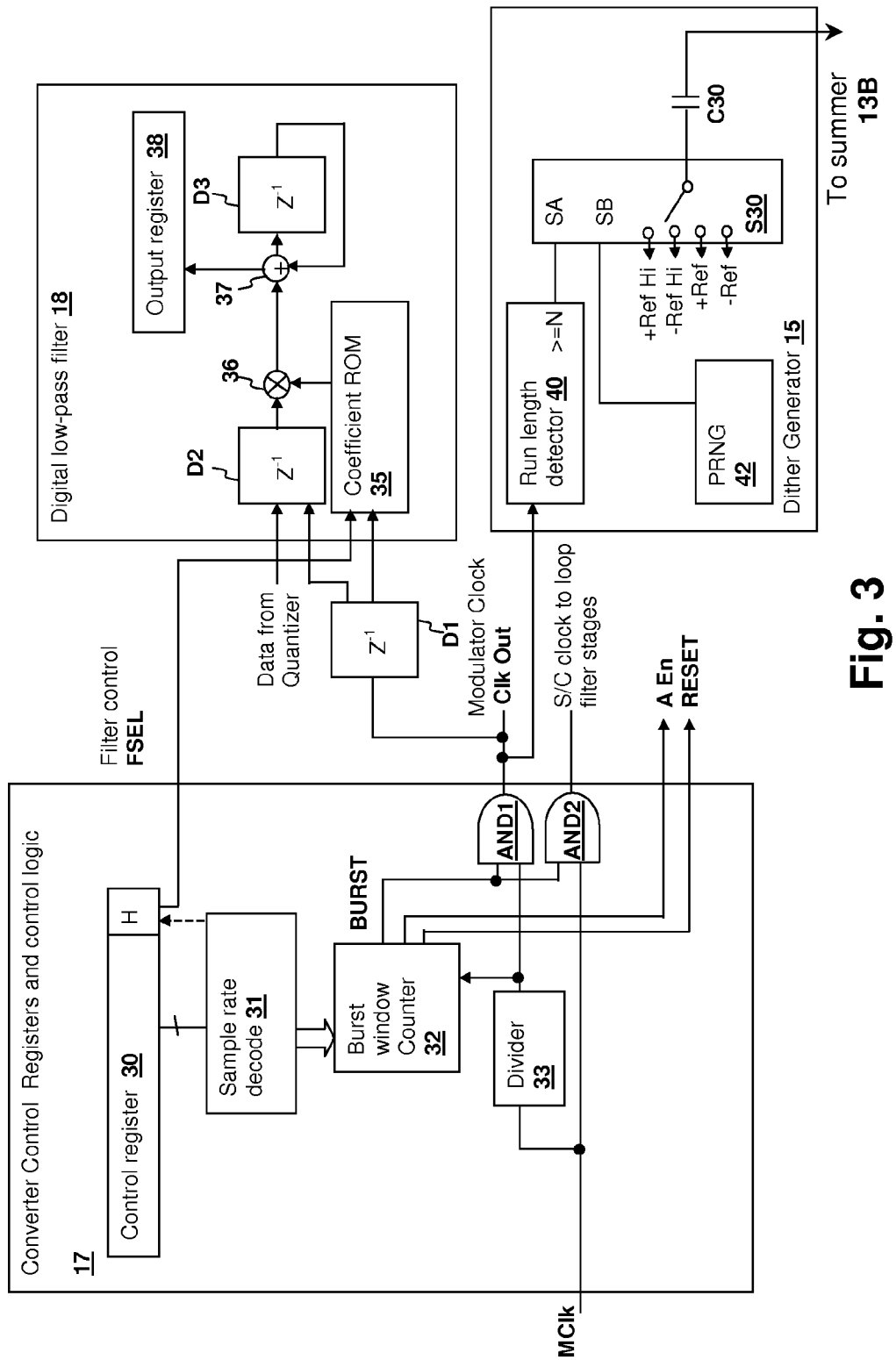
FIG. 3 is a block diagram depicting the structure of converter control registers and control logic 17, digital low-pass filter 18 and dither generator 15 of FIG. 1.

Referring now to FIG. 3, details of converter control registers and control logic 17 and digital low-pass filter 18 of FIG. 1 are shown. Within converter control registers and control logic 17, a control register 30 receives at least a sample rate selection value and an optional bit H for controlling the mode of digital low-pass filter 18. Bit H may be set automatically in response to a decode of the sample rate provided by sample rate decoder 31 to a burst window counter 32, so that the half-filter mode described above is automatically engaged when the lower (intermittent mode) sample rate is selected. Burst window counter 32 receives a clock input from a divider 33 that scales the master clock signal MClk to the operating frequency of the modulator. A logical AND gate AND1 provides a burst of clock pulses at the rate of the output of divider 33 to the modulator as the Clk Out signal and logical AND gate AND2 provides a burst of clock pulses at the rate of master clock signal MClk to operate switched-capacitor integrators in analog loop filter 11 of FIG. 1. If continuous-mode integrators are employed, divider 33 is not used, and master clock signal MClk can be provided at the modulator clock rate.

Burst window counter 32 also provides the A En signal and RESET signals from decodes of the internal count, so that the A En signal is activated several counts prior to the BURST signal being asserted, and the RESET signal is de-asserted after the A En signal is activated and just prior to the BURST signal being asserted. When the higher sample rate (continuous mode) is selected and detected by sample rate decoder 31, burst window counter 32 asserts the BURST signal continuously to enable logical AND gates AND1 and AND2, and also continuously asserts the A En signal and de-asserts the RESET signal, to provide continuous operation of the modulator 10 of FIG. 1.

A unit clock delay D1 delays the modulator clock to clock the values at the output of delta-sigma modulator 10 into latch D2, and also to clock coefficients from coefficient ROM 35. The output of coefficient ROM 35 and the output of latch D2 are multiplied by a multiplier 36 and summed by an adder 37 with accumulated previous addition results of adder 37 that are stored in latch D3. The H bit is provided to coefficient ROM 35 to select between coefficients of the half-filter or full filter response as described above. An output register 38 provides for latching the resultant accumulation of the products of the coefficients and the output values from delta-sigma modulator 10, resulting in the convolution that yields the low-pass filter output.

Details of dither generator 15 are also shown in FIG. 3. A run-length detector 40 provides a $>=N$ output indicating that the last N codes have the same value. For example, for N=11, if 11 codes are received that all have the same value, the $>=N$ output signal of run-length detector 40 is asserted. As mentioned above, run-length detector 40 is designed to ignore long runs of the extreme maximum or minimum codes, so that the $>=N$ output is not activated if quantizer 14 is saturated. A pseudo-random number generator (PRNG) 42 provides a control output that operates the select SA of a multiplexer switch S30 that when the output of run length detector is low, alternates the polarity of a reference voltage (+Ref, −Ref) applied to capacitor C30. The output of run length detector 40 controls the select SB input of multiplexer switch S30 so that when a long run (e.g., 11 codes) of the same value are detected, the dither voltage is increased by alternating between another set of reference voltages (+Ref Hi, −Ref Hi). Exemplary values of dither correspond to +/−0.22 of a quantizer step for the normal dither level and a full quantizer step under unchanging quantizer output code conditions.

Referring now to FIG. 4A, a switched-capacitor integrator stage that may be used to implement integrators 11A-11C of FIG. 1 is depicted. Although a single-ended switched-capacitor integrator is shown for simplicity, a fully differential switched-capacitor integrator stage is generally used in the converter. Switches S40A and S40B apply capacitor C1 alternatively to the input node of the stage and to the summing node of amplifier A, thus producing operation as a resistance. Feedback capacitor C2 in combination with the input resistance yields an integrator. Logical AND gate AND2 is shown as controlling the burst of pulses applied to switches S40A and S40B in the intermittent conversion mode, which will be a continuous MClk signal in the continuous conversion mode. Analog circuit enable signal A En is supplied to the gate of transistor NB, which controls the bias current levels $I_{Bias}$ in amplifier A. Amplifier A acts as an integrator as described above, and is reset by switch S42 in response to the RESET signal.

Referring now to FIG. 4B, a continuous time integrator that may be used as an alternative to the discrete-time circuit of FIG. 4A is shown. Only differences between circuits of FIGS. 4A and 4B will be described below. Rather than including a switched-capacitor input circuit, a resistor R1 is employed. Since capacitor C2 is held in a discharge state when the RESET signal is asserted, no additional modification to the circuit is necessary to reset the state of the integrator. However, in intermittent operating mode, the RESET signal in the circuit of FIG. 4B must be controlled such that it is released just as the conversion cycle is beginning in order to avoid drift, whereas in the circuit of FIG. 4A, integration of the applied input signal does not commence until the BURST signal is asserted.

Referring now to FIG. 4C, an alternative method and apparatus for controlling the power consumption of amplifier A in the switched-capacitor integrator of FIG. 4A is illustrated. Rather than controlling the bias current of amplifier A, analog circuit enable signal A En is supplied to the gate of transistor N1 and an inverter I1 supplies an inverter version of signal A En to transistor P1, which controls the application of the analog power supplies to amplifier A, thus disabling the integrator.

Referring now to FIG. 4D, an alternative method and apparatus for controlling the power consumption of amplifier A in the continuous-time integrator of FIG. 4B is illustrated. As in the circuit of FIG. 4C, analog circuit enable signal A En is supplied to the gate of transistor N1 and an inverter I1 supplies an inverter version of signal A En to transistor P1, which controls the application of the analog power supplies to amplifier A, thus disabling the integrator.

While the invention has been particularly shown and described with reference to the preferred embodiments thereof, it will be understood by those skilled in the art that the foregoing and other changes in form and details may be made therein without departing from the spirit and scope of the invention.

What is claimed:

1. A delta-sigma modulator circuit, comprising:
 a noise shaping filter;
 a quantizer having an input coupled to an input of said noise shaping filter;
 a run length detector for detecting a pattern of sequential identical levels received from an output of said quantizer;
 a dither generating circuit having an input coupled to an output of said quantizer and a dither output for providing a dither signal to an input of said quantizer, wherein a magnitude of said dither signal is controlled by said run length detector in operational dependence on a detected pattern of output samples of said quantizer.

2. The delta-sigma modulator of claim 1, wherein said magnitude of said dither signal is reduced when said run length detector indicates that said quantizer output is changing states.

3. The delta-sigma modulator of claim 2, wherein said magnitude of said dither signal is set to zero when said run length detector indicates that said quantizer output is changing states.

4. The delta-sigma modulator of claim 1, wherein said magnitude of said dither signal has a peak-to-peak amplitude at said input to said quantizer corresponding to less than half of one level of said quantizer when said run length detector indicates that said quantizer is changing between output states and a peak-to-peak amplitude of greater than half of one level of said quantizer when said run length detector indicates that said quantizer output is not changing states.

5. The delta-sigma modulator of claim 1, wherein said magnitude of said dither signal is set to zero when said run length detector indicates that said output of said quantizer is at an extreme maximum or minimum output level.

6. The delta-sigma modulator of claim 1, wherein said magnitude of said dither signal is not increased when said run length detector detects a pattern of sequential identical levels at said output of said quantizer that represent one of an extreme maximum and minimum output level.

7. The delta-sigma modulator circuit of claim 1, further comprising a digital-to-analog converter having an input coupled to said output of said quantizer and an output coupled to said noise-shaping filter for providing a feedback signal, and wherein said dither generating circuit modifies an input of said digital-to-analog converter to provide said dither output to said noise shaping filter.

8. The delta-sigma modulator circuit of claim 1, wherein said noise-shaping filter is a feed-forward filter having a plurality of feed-forward paths, and wherein said plurality of feed-forward paths is combined by a summer having a plurality of inputs for receiving said plurality of feed-forward paths and an output for providing said input of said quantizer and a dither input for receiving said dither signal.

9. The delta-sigma modulator circuit of claim 8, further comprising a scaling circuit for coupling said dither signal to said dither input of said summer and scaling an amplitude of said dither signal in response to a detected pattern of said quantizer output signal.

10. The delta-sigma modulator of claim 9, wherein said scaling circuit comprises:
a random number generator; and
a selector for alternating between a pair of lower-magnitude reference voltages having opposite polarity in response to said run length detector indicating that said pattern is not detected, and between a pair of higher-magnitude reference voltages having opposite polarity in response to said run length detector indicating that said pattern is detected.

11. The delta-sigma modulator of claim 10, wherein said higher-level reference voltage has a voltage corresponding to at least a step size of said quantizer.

12. A delta-sigma modulator circuit, comprising:
a noise shaping filter;
a quantizer having an input coupled to an input of said noise shaping filter;
a detection circuit for detecting when an output of said quantizer is repeatedly producing at least one particular code; and
a signal injection circuit for producing a signal at said input of said quantizer in response to said detection circuit indicating that said output of said quantizer is repeatedly producing an identical code value.

13. The delta-sigma modulator circuit of claim 12, further comprising a digital-to-analog converter having an input coupled to said output of said quantizer and an output coupled to said noise-shaping filter for providing a feedback signal, and wherein said signal injection circuit modifies an input of said digital-to-analog converter to provide said dither output to said noise shaping filter.

14. The delta-sigma modulator circuit of claim 12, wherein said noise-shaping filter is a feed-forward filter having a plurality of feed-forward paths, and wherein said plurality of feed-forward paths is combined by a summer having a plurality of inputs for receiving said plurality of feed-forward paths and an output for providing said input of said quantizer and another input for receiving said signal provided by said signal injection circuit.

15. A method of preventing repeated sequences of constant value from the output of a delta-sigma modulator, comprising:
detecting a pattern of sequential unchanging output values of said delta-sigma modulator;
injecting a signal into an input of a quantizer of said delta-sigma modulator in response to said detecting, whereby said quantizer output is forced to change value.

16. The method of claim 15, wherein said injecting comprises injecting a dither signal having a characteristic adjusted in conformity with a result of said detecting.

17. The method of claim 15, wherein said injecting injects said signal only if said pattern of sequential unchanging output values is detected.

18. The method of claim 15, wherein said injecting comprises injecting a signal having an amplitude scaled in conformity with a result of said detecting.

19. The method of claim 18, wherein said injecting comprises injecting a signal having an amplitude that is at least the magnitude of a step size of said quantizer, in response to said detecting until said a change in said output of said delta-sigma modulator is detected.

20. The method of claim 19, further comprising reducing said amplitude of said signal in response to detecting said change.

* * * * *